United States Patent
Hatakeyama

(10) Patent No.: US 6,948,097 B2
(45) Date of Patent: Sep. 20, 2005

(54) SEMICONDUCTOR DEVICE INCLUDING FUNCTION VERIFICATION CAPABILITY

(75) Inventor: Tsutomu Hatakeyama, Kanagawa-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 506 days.

(21) Appl. No.: 10/043,191

(22) Filed: Jan. 14, 2002

(65) Prior Publication Data

US 2002/0108056 A1 Aug. 8, 2002

(30) Foreign Application Priority Data

Jan. 16, 2001 (JP) .................................. P2001-007676

(51) Int. Cl.$^7$ .............................................. G06F 11/00
(52) U.S. Cl. ........................................ 714/30; 714/734
(58) Field of Search ........................ 714/30, 29, 31–32, 714/718, 724–725, 733–735; 365/200, 201, 208, 212

(56) References Cited

U.S. PATENT DOCUMENTS

| 5,233,610 A | * | 8/1993 | Nakayama et al. ......... 714/704 |
| 5,278,839 A | * | 1/1994 | Matsumoto et al. ........ 714/710 |
| 5,299,168 A | * | 3/1994 | Kang .......................... 365/222 |
| 5,416,740 A | * | 5/1995 | Fujita et al. ................ 365/200 |
| 5,428,575 A | * | 6/1995 | Fudeyasu .................... 365/201 |
| 5,463,585 A | * | 10/1995 | Sanada ....................... 365/201 |
| 5,675,540 A | * | 10/1997 | Roohparvar ........... 365/185.22 |
| 6,085,336 A |   | 7/2000 | Swoboda et al. |
| 6,483,748 B2 | * | 11/2002 | Futatsuya et al. ...... 365/185.11 |

* cited by examiner

Primary Examiner—Dieu-Minh Le
(74) Attorney, Agent, or Firm—Oblon, Spivak, McClelland, Maier & Neustadt, P.C.

(57) ABSTRACT

By executing internal verification block instructions in a semiconductor device having a function verification capability, internal verification blocks (11-1, ..., and 11-n) supply optional input data items to corresponding target verification blocks (12-1, ..., and 12-n) at optional timings, and operation verification for the target verification blocks (12-1, ..., and 12-n) is performed.

12 Claims, 5 Drawing Sheets

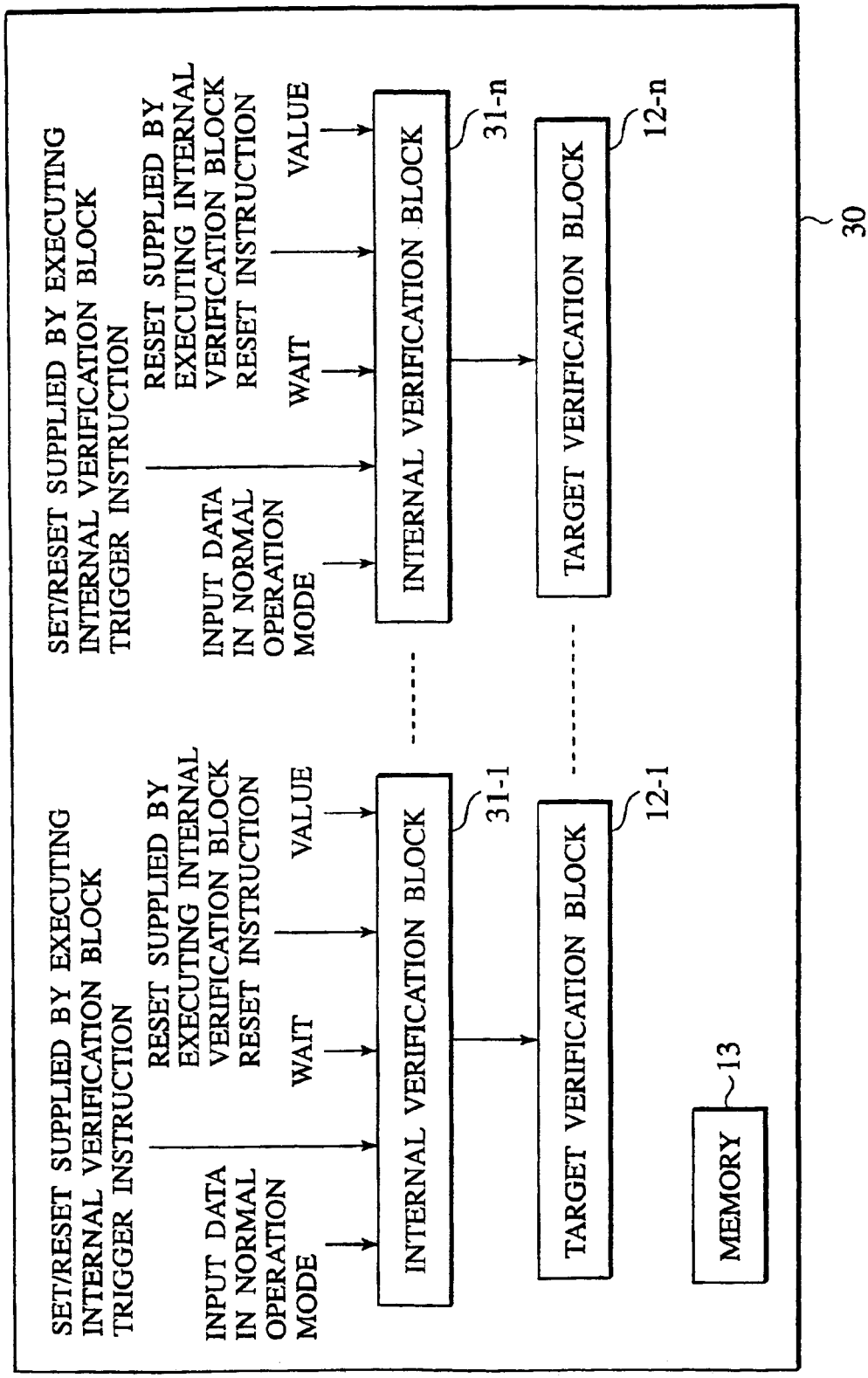

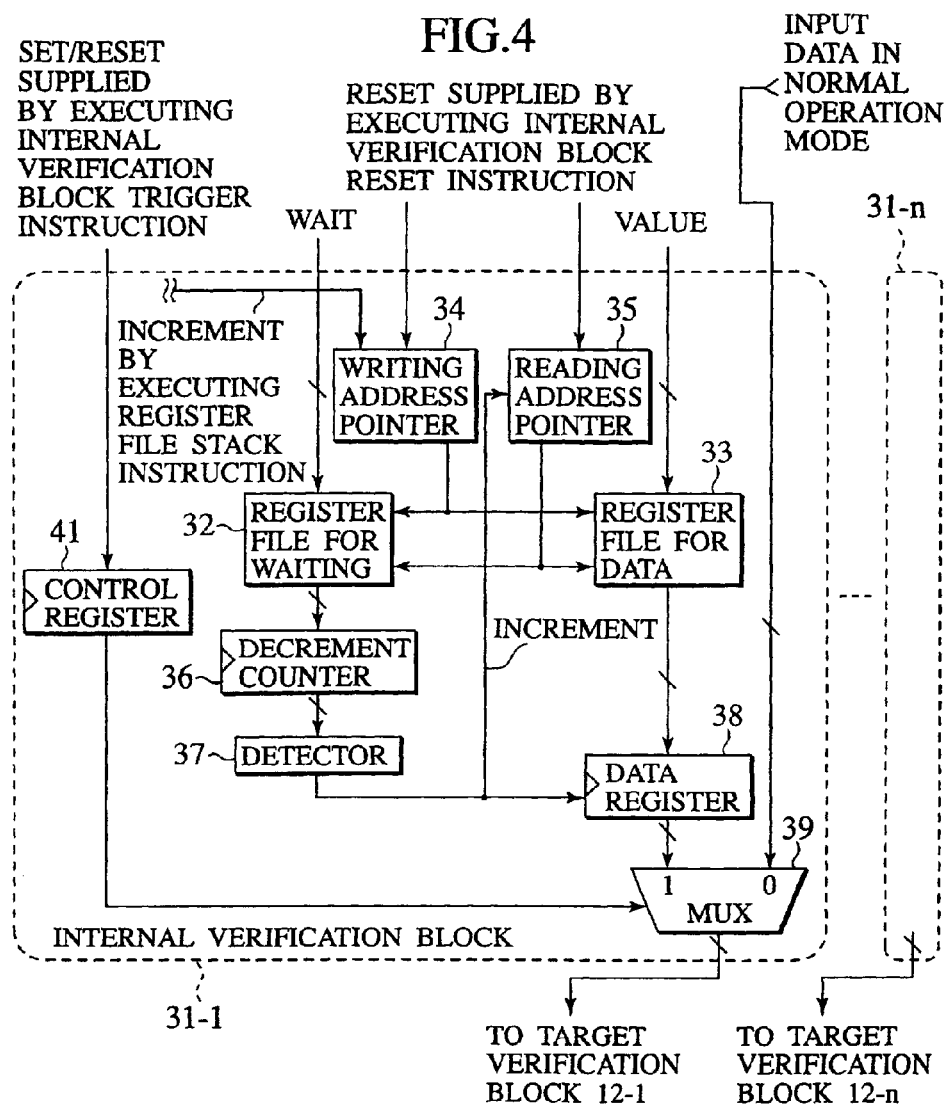

SEMICONDUCTOR DEVICE INCLUDING FUNCTION VERIFICATION CAPABILITY

CROSS REFERENCE TO REILATED APPLICATIONS

This application is based upon and claims the benefit of priority from prior Japanese Patent Application No. P2001-7676, filed on Jan. 16, 2001; the entire contents of which are incorporated by reference herein.

BACKGROUND OF THE INVENTION

1. Field of the Invention

The present invention relates to a semiconductor device including function verification capability for performing function verification for target function blocks by supplying optional input data to the target function blocks at desired timings.

2. Description of the Related Art

In the evaluation for processor development, when a pipeline dependent operation verification program for a target processor is written in a computer language, there is a case in which optional values are adopted for optional pins and registers at optional timings. For example, in a simulation of RTL (Register Transfer Level), it is necessary to set additional input data by a simulator in order to verify a function relating to input data caused by an external interrupt.

On the other hand, when a processor is used as IP (Intellectual Property, as a function block), it is necessary to verify an operation with consideration given to external input data. However, it is difficult, in general, to prepare verification programs according to a specification per IP connected externally. Moreover, when a pipeline dependent verification program is executed in an actual application device, it is inefficiency to set data into registers based on scan path manner. Further, it is necessary to set an additional device for setting external input data for a verification program for verifying a function using external input data.

As described above, in the operation verification with consideration given to the external input data to be supplied to the processor, it is necessary to perform the setting by a simulator and to use a verification program per target IP in order to supply an optional input data at a desired timing. Furthermore, to set the input data based on scan path manner is inefficiency, and it is necessary to use additional device for setting external input data.

SUMMARY OF THE INVENTION

An aspect of the present invention provides a semiconductor device having a function verification capability. The semiconductor device includes an internal verification block receiving and storing a first input value and a cycle value. After receiving and storing the first input data and the cycle value, the internal verification block then supplies the first input data to a target verification block instead of a second input data which is for use in a normal operation after a time indicated by the cycle time is elapsed, where, the cycle value is a timing to supply the first input value to the target verification block corresponding to the internal verification block. Both the first input data and the cycle value are for use in an operation verification according to execution of internal verification instructions during the operation verification.

BRIEF DESCRIPTION OF THE DRAWINGS

FIG. 3 is a diagram showing a configuration of a semiconductor device according to another embodiment of the present invention;

FIG. 4 is a diagram showing a configuration of an internal verification block in the semiconductor device shown in FIG. 3;

FIG. 5 is a diagram showing an example of an instruction string to be used in the configuration shown in FIG. 4.

DETAILED DESCRIPTION OF EMBODIMENTS

Figure 1:
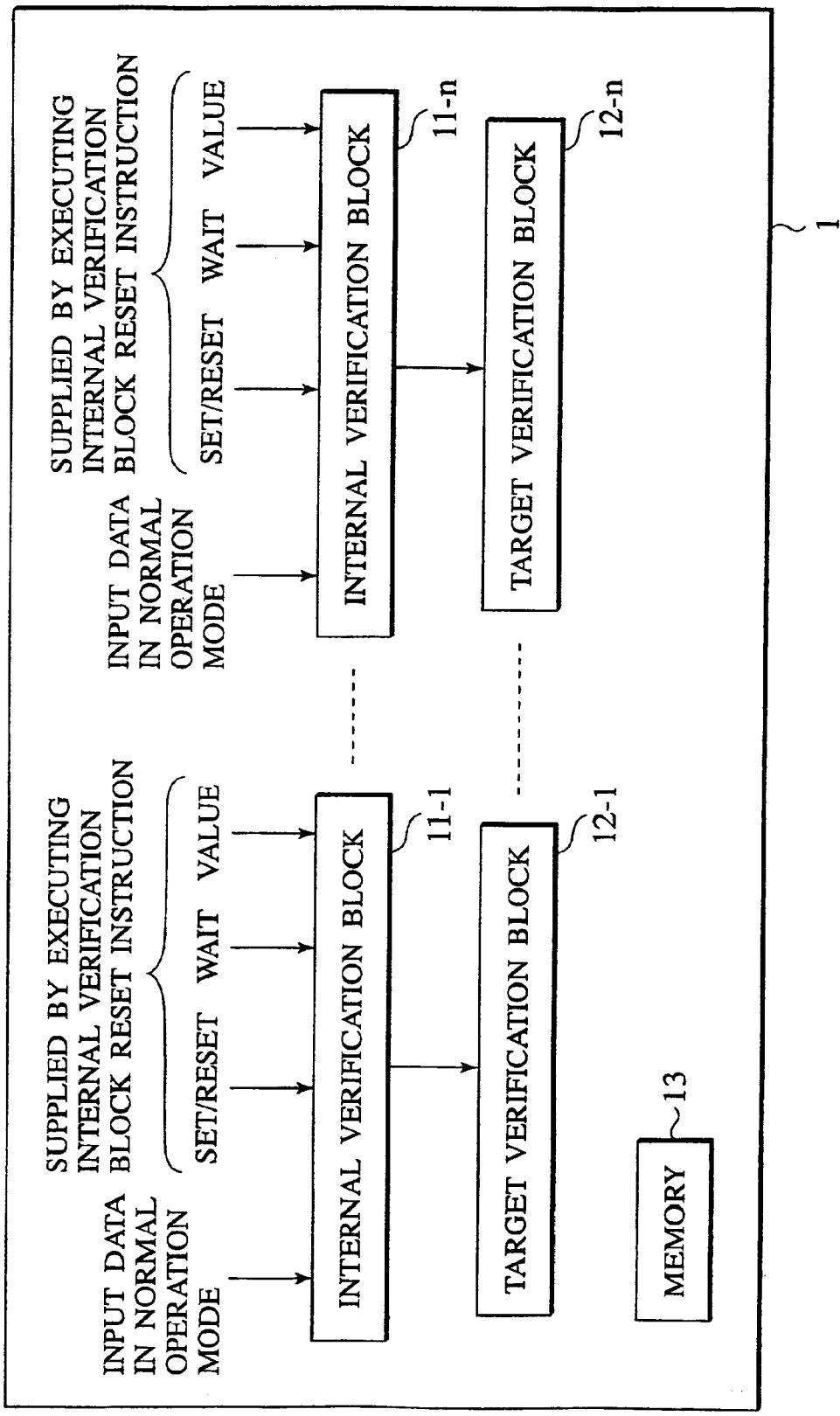
FIG. 1 is a diagram showing a configuration of a semiconductor device according to an embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

FIG. 1 is a diagram showing a configuration of a semiconductor device 1, for example, a processor, according to a first embodiment of the present invention.

In FIG. 1, the semiconductor device 1 comprises a plurality of internal verification blocks 11-1, . . . , and 11-$n$, target verification blocks 12-1, . . . , and 12-$n$ corresponding to the internal verification blocks 11-1, . . . , and 11-$n$, and a memory 13. The internal verification blocks 11-1, . . . , and 11-$n$ supply input data to the corresponding target verification blocks 12-1, . . . , and 12-$n$ in order to verify the operation thereof. The memory 13 is a normal memory used under a normal operation mode of the processor and stores control instructions by which the operation of the internal verification blocks 11-1, . . . , and 11-$n$ is controlled.

In this configuration described above, optional data items are transferred from the internal verification blocks 11-1, . . . , and 11-$n$ to the target verification blocks 12-1, . . . , and 12-$n$ and then set into internal registers in the target verification blocks 12-1, . . . , and 12-$n$ through input pins thereof at desired cycles to which an operator wants. Various functions of the processor including functions based on external input data are then verified in the processor itself in cycle level $^6$y using dedicated control instructions, to be executed by processor instructions. The operations of the internal verification blocks 11-1, . . . , and 11-$n$ are controlled based on those processor instructions.

Figure 2:
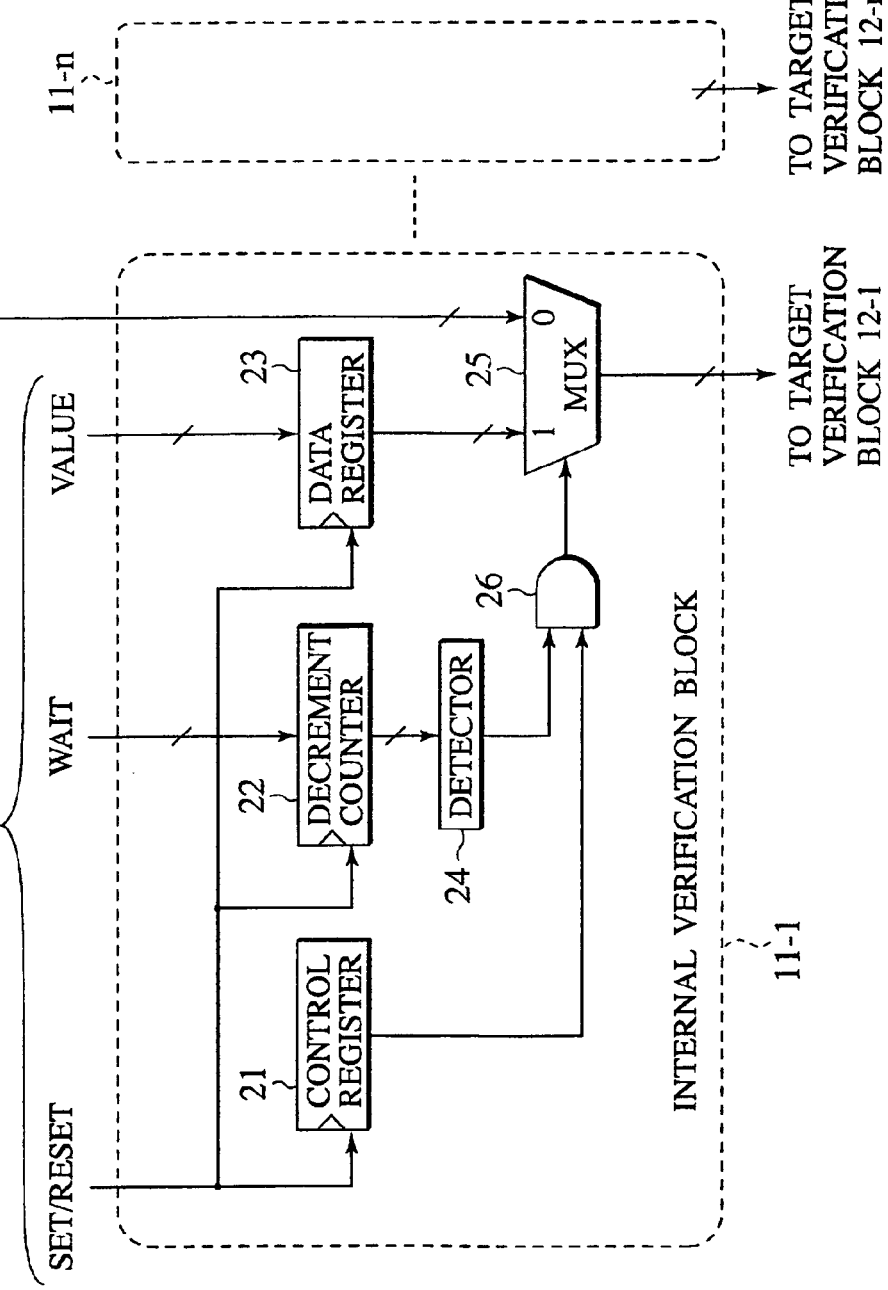
FIG. 2 is a diagram showing a configuration of an internal verification block in the semiconductor device shown in FIG. 1.

FIG. 2 is a diagram showing a configuration of an embodiment of one of the internal verification blocks 11-1, . . . , and 11-$n$ in the semiconductor device 1 shown in FIG. 1. In FIG. 2, the internal verification block comprises a control register 21, a decrement counter 22, a data register 23, a detector 24, a multiplexer (MUX) 25, and a AND gate 26.

Those components such as the internal verification blocks 11-1, . . . , and 11-$n$, the decrement counter 22, the data register 23, the detector 24, the MUX 25, and the AND gate 26 are controlled in operation based on the execution of an internal verification block instruction group including an internal verification block set instruction and an internal verification block reset instruction.

Into the control register 21, information "set" (=1) or "reset" (=0) is set by executing the internal verification block set instruction in the internal verification block instruction group. According to this information "set" (=1) or "reset" (=0) stored in the control register 21, one of the input data in the normal operation mode and input data "value" in an operation verification mode is selected.

Into the decrement counter 22, a cycle value "wait" is also set by executing the internal block set instruction. This cycle value "wait" becomes the timing at which the input data "value" for the operation verification is supplied to the corresponding target verification blocks 12-1, ..., and 12-n.

Into the data register 23, the input data "value" for use in the operation verification is also set by execution the internal verification block instruction.

The detector 24 decrements the value stored in the decrement counter 22 only during no assertion, and asserts the signal "1" to the AND gate 26 when the value of the decrement counter 2 is zero.

The multiplexer MUX 25 selects one of input data for use in the normal operation mode, that are supplied through external pins, supplied from the internal registers or other verification blocks, and the input data "value" stored in the data register 23 for use in the operation verification mode. The multiplexer MUX 25 then supplies the selected one to the corresponding target verification block.

In the configuration described above, the semiconductor device of the first embodiment is capable of operating the internal verification blocks 11-1, ..., and 11-n based on the internal verification block group that are executed in synchronization with a writing stage in pipeline for the processor.

The internal verification block instruction group described above includes following two instructions:

Internal verification block set instruction "set": number wait value; and

Internal verification block reset instruction "reset": number.

The internal verification block set instruction is read from the memory 13 shown in FIG. 1 and then executed, so that the internal verification block corresponding to the number (for example, 11-1, ..., and 11-n shown in FIG. 1) designated in the instruction is put (activated) in motion and supplies input data "value", instead of the input data for the normal operation mode, to the target verification block after the cycle "wait" is elapsed.

The internal verification block reset instruction "reset" is read from the memory 13 shown in FIG. 1 and then executed, so that the internal verification block designated by the number is returned to the normal operation mode, namely, the normal processor mode.

In the configuration described above, in order to supply input data items from the internal verification blocks 11-1, ..., and 11-n to the target verification blocks 12-1, ..., and 12-n, the values "set (=1)", "wait", and "value" are set into the control register 21, the decrement counter 22, and the data register 23, respectively, by execution of the internal verification block set instruction.

The decrement counter 22 always performs the decrement excepting when the value is set into the decrement counter 22 and the value of the decrement counter 22 is zero. When the counter value of the decrement counter 22 is reached to zero, the detector 24 outputs the value "1" to the AND gate 26, the MUX 25 selects the value stored in the data register 23 instead of the input data in the normal operation mode, and outputs the selected one to the target verification blocks 12-1, ..., and 12-n.

It is thereby possible to supply optional values to the target verification blocks 12-1, ..., and 12-n at optional timing. Output data signals from those target verification blocks 12-1, ..., and 12-n are checked in order to verify the operation of each target verification block.

This enables the user to describe a test program with consideration given to external input data, and it is thereby possible to perform a system debugging. Furthermore, it is also possible to describe BIST (built-in-test) program considering external input data for actual devices.

Second Embodiment

FIG. 3 is a diagram showing a configuration of a semiconductor device 30 according to a second embodiment of the present invention. FIG. 4 is a diagram showing a configuration of internal verification blocks 31-1, ..., and 31-n in the semiconductor device 30 shown in FIG. 3.

The first embodiment described above shown in FIGS. 1 and 2 has proposed the internal verification blocks 11-1, ..., and 11-n capable of transferring optional input data to the corresponding target verification blocks 12-1, ..., and 12-n at optional timings by an operator who wants to perform the verification of the target verification blocks 12-1, ..., and 12-n. In this first embodiment, only one data item can be supplied and set to the corresponding target verification block instead of a data item in the normal operation mode. It is therefore difficult to continuously supply a plurality of data items to the corresponding target block.

In the second embodiment, in order to apply the concept of the present invention to the above case, an additional register file and an additional address pointer to control the operation of the additional register file are introduced and mounted. This can expand the function of the internal verification blocks in the semiconductor device.

In FIG. 4, each of the internal verification blocks 31-1, ..., and 31-n comprises a control register 41, a register file 32 for waiting, a register file 33 for data, a writing address pointer 34, a reading address pointer 35, a decrement counter 36, a detector 37, a data register 38, and a multiplexer (MUX) 39. The operation of each internal verification block is controlled by an internal verification block instruction group including an internal verification block reset instruction, a register file stack instruction, and an internal verification block trigger instruction.

Into the control register 41, information "set" (=1) or "reset" (=0) is set in order to select one of input data in the normal operation mode and input data "value" in the operation verification mode by executing the internal verification block trigger instruction in the internal verification block instruction group, for example.

Into the register file 32, a plurality of cycle values "wait" for waiting are stored sequentially by executing the register file stack instruction and one of the cycle values "wait" is read from it per asserting of the detector 37.

Into the register file 33 for data, a plurality of input data items "value" are stored sequentially by executing the register file stack instruction and one of the cycle values "wait" is read from it per asserting of the detector 37.

The writing address pointer 34 is reset by executing the internal verification block reset instruction, and incremented by executing the register file stack instruction. The writing address pointer 34 transfers a writing address to the register file 32 for waiting when the cycle value "wait" is written into this register-file 32, and also transfers a target address to the register file 33 for data when the input data "value" is written into this register file 33.

The reading address pointer 35 is reset by executing the internal verification block reset instruction, and incremented every assertion of the detector 37. The reading address pointer 35 also transfers an readout address to the register file 32 for waiting when the value "wait" is read from this register file 32, or transfers a readout address to the register file 33 for data when the input data "value" is read from this register file 33.

The decrement counter 36 loads a new value from the register file 32 for waiting when the internal verification block trigger instruction or the detector 37 is asserted. On the contrary, when not asserted the data in the decrement counter 36 is decremented.

The detector 37 asserts the signal to the reading address pointer 35 and the data register 38 when the value stored in the decrement counter 36 is zero.

A new data item "value" is set into the data register 38 in synchronization with the operation of the decrement counter 36.

The MUX 39 in the internal verification block selects one of input data through external pins, input data during the normal operation mode supplied from the internal register 38 or other target verification block, the input data "value" stored in the data register 38 during the operation verification mode, and transfers the selected one to the target block 12-$n$ that corresponds to this internal verification block 31-$n$.

The instruction group used in this embodiment comprises following three instructions.

Internal verification block reset instruction "reset": number;

Register file stack instruction "push": number, wait, value; and

Internal verification block trigger instruction "trigger": number.

Internal verification block reset instruction is an instruction to reset the internal verification block specified by "number", namely, initializes the control register 41, the decrement counter 36, the data register 38, the reading address pointer 34, and the writing address pointer 35.

The register file stack instruction is an instruction to write the cycle number "wait" and the input data "value" of the number of the internal verification block to the register files 32 and 33 and to increment the writing address pointer 34 simultaneously with this writing.

The internal verification block trigger instruction is an instruction to activate the internal verification block that is specified by the "number". When the internal verification block trigger instruction is executed, the signal value "set" (=1), by which the input data "value" during the operation verification mode is selected, is set into the control register 41. In addition, the decrement counter 36 in the internal verification block specified by "number" initiates the countdown in synchronization with a writing state in the internal verification block trigger instruction. After this, a following value is loaded and the reading address pointer 35 is incremented by one at every zero of the count value in the decrement counter 36.

Figure 6:
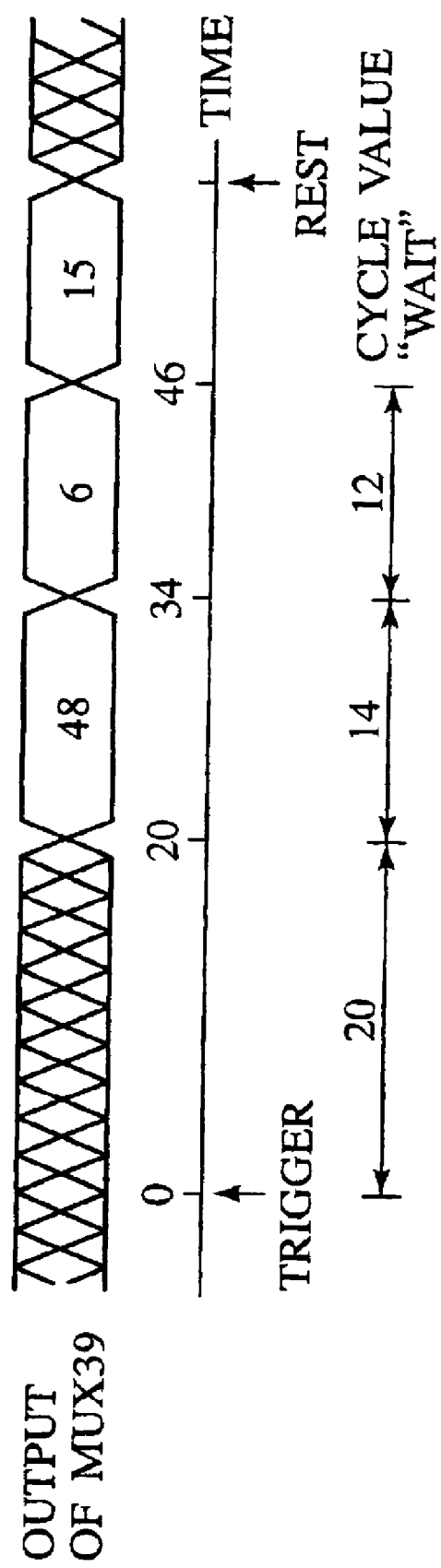
FIG. 6 is a timing chart showing data items to be supplied from MUX to a corresponding target verification block by executing instructions shown in FIG. 5.

By using those instructions described above, for example, input data "value=48" is supplied continuously to the target verification block 12-1 specified by "number=1" from 20-th cycle elapsed after the internal verification block trigger instruction is executed. Following this, the input data "value=6" is then supplied continuously at 14 cycles elapsed (namely, at 34 cycles elapsed after the internal verification block trigger instruction is executed). Further, the input data "value=15" is supplied continuously at 12 cycles elapsed (namely, at 46 cycles elapsed after the internal verification block trigger instruction is executed) until the internal verification block reset instruction is executed. Fis. 5 shows the instruction series performing the above steps. FIG. 6 is a timing chart thereof.

In both FIG. 5 and FIG. 6, when the internal verification block reset instruction "reset" is executed under a condition where the target verification block 12-1 enters the normal operation mode in which the input data is selected by MUX 39 and then transferred to the target verification block 12-1, the internal verification block 31-1 specified by "number=1" is reset. The register file stack instruction "push 1, 20, 48" is then executed, the cycle value "wait=20" is set into the register file 32 for waiting based on the address supplied from the writing address pointer 34, In addition to this, the input data "value=48" corresponding to the cycle value "wait=20" is set into the register file 33 for data based on the address supplied from the writing address pointer 34. Following this, the register file stack instruction "push 1, 14, 6" is executed, and the cycle value "wait=14" is set into the register file 32 for waiting based on the address supplied from the writing address pointer 34, In addition to this, the input data "value=6" corresponding to the cycle value "wait=14" is set into the register file 33 for data based on the address supplied from the writing address pointer 34. Furthermore, the register file stack instruction "push 1, 12, 15" is executed, and the cycle value "wait=12" is set into the register file 32 for waiting based on the address supplied from the writing address pointer 34, In addition to this, the input data "value=15" corresponding to the cycle value "wait=12" is set into the register file 33 for data based on the address supplied from the writing address pointer 34.

In this state described above, by executing the internal verification block trigger instruction "trigger", the internal verification block 31-1 specified by "number=1" is activated and the signal "trigger" (=1) is then set into the control register 41 in the internal verification block 31-1. Then, the decrement counter 36 in the internal verification block 31-1 reads the cycle value "wait=20" stored in the register file 32 for waiting, and the decrement of the cycle value "wait=20" set in the decrement counter 36 is then initiated. After the decrement, when the detector 37 detects that the value of the decrement counter 36 is reached to zero, the detector 37 outputs the instruction to initiate the reading of the address pointer to the reading address pointer 35. The reading address pointer 35 transfers the reading address to the register file 33 for data based on this instruction. Thereby, the input data "value=48" corresponding to the cycle value "wait=20" is read from the register file 33 for data and set to the data register 38 based on the reading address. This input data "value=48" set in the data register 38 is selected by the MUX 39 and supplied to the target verification block 12-1.

On the other hand, when the input data "value=48" is read from the register file 33 for data, the decrement counter 36 simultaneously reads the cycle value "wait=14" stored in the register file 32 for waiting based on the address supplied from the reading address pointer 35, and so that the decrement of the cycle value "wait=14" in the decrement counter 36 is initiated.

After the decrement, when the detector 37 detects that the value of the decrement counter 36 is reached to zero, the detector 37 outputs the instruction to initiate the reading of the address pointer to the reading address pointer 35. The reading address pointer 35 transfers the reading address to the register file 33 for data based on this instruction. Thereby, the input data "value=6" corresponding to the cycle value "wait=14" is read from the register file 33 for data and set to the data register 38 based on the reading address.

This input data "value=6" set in the data register 38 is selected by the MUX 39 and the selected one is then supplied to the target verification block 12-1, instead of the input data "value=48" that has been stored in this target verification block 12-1.

On the other hand, when the input data "value=6" is read from the register file 33 for data, the decrement counter 36 simultaneously reads the cycle value "wait=12" stored in the register file 32 for waiting based on the address supplied from the reading address pointer 35, and so that the decrement of the cycle value "wait=12" in the decrement counter 36 is initiated.

After the decrement, when the detector 37 detects that the value of the decrement counter 36 is reached to zero, the detector 37 outputs the instruction to initiate the reading of the address pointer to the reading address pointer 35. The reading address pointer 35 transfers the reading address to the register file 33 for data based on this instruction. Thereby, the input data "value=15" corresponding to the cycle value "wait=12" is read from the register file 33 for data and set to the data register 38 based on the reading address. This input data "value=15" set in the data register 38 is selected by the MUX 39 and the selected one is then supplied to the target verification block 12-1, instead of the input data "value=6" that has been stored in this target verification block 12-1.

This input data "value=15" is supplied continuously to the target verification block 12-1 until the internal verification block reset instruction "reset" to stop the verification is executed. When the internal verification block reset instruction "set" is executed, the internal verification block 31-1 is reset, and the MUX 39 selects the input data for the normal operation mode instead of the input data "value" in the operation verification mode stored in the register file 33 for data, and the MUX 39 supplies the selected one to the target verification block 12-1.

By executing such the instructions described above, a plurality of input data "value" to be supplied during the operation verification mode are set into the register file 33 for data. The input data "value" stored in the register file 33 is supplied to the target verification block 12-1 sequentially every time elapsed of the cycle value "wait" corresponding to each input data "value" in order to perform the operation verification for the target verification block 12-1.

Accordingly, this semiconductor device of the second embodiment has the same effect of the semiconductor device of the first embodiment, and can supply a plurality of input data to the corresponding target verification block continuously.

As set forth, according to the present invention, it is possible to perform the operation verification for one or more target verification blocks by supplying optional input data with optional timings. It is thereby possible to describe test programs with consideration given to external input data and also to perform easy system debugging. In addition, it is possible to describe BIST (buit-in-test) programs with consideration given to external input data in an actual device.

The present invention may be embodied in other specific forms without departing from the spirit or essential characteristics thereof. The embodiments are therefore to be considered in all respects as illustrative and not restrictive, the scope of the present invention being indicated by the appended claims rather than by the foregoing description, and all changes which come within the meaning and range of equivalency of the claims are therefore intended to be embraced therein.

What is claimed is:

1. A semiconductor device having a function verification capability comprising:

an internal verification block receiving and then storing a desired first input value and a desired cycle value being a timing to supply the first input value to a target verification block corresponding to the internal verification block, both values being for use in an operation verification according to execution of internal verification instructions being executed in synchronization with one stage in pipeline for the semiconductor device during the operation verification, and supplying the first input data to the target verification block instead of a second input data being for use in a normal operation after a time indicated by the cycle time is elapsed after receiving and storing the first input data and the cycle value.

2. The semiconductor device having a function verification capability according to claim 1, wherein a plurality of the first input data and the corresponding cycle values are set to the internal verification block continuously, and each of the first input data is supplied to the target verification block every a lapse of the corresponding cycle value.

3. The semiconductor device having a function verification capability according to claim 1, wherein the internal verification block comprises:

a register storing the first input value;

a counter, to which the cycle value is set, decrementing this cycle value;

a detector detecting that the value of the counter becomes zero; and a multiplexer selecting the first input data stored in the register instead of the second input data for use in the normal operation when the detector detects that the value of the counter becomes zero, and supplying the selected one to the target verification block.

4. The semiconductor device having a function verification capability according to claim 1, wherein the internal verification block comprises:

a data register file storing a plurality of the continuous first input data;

a wait register file storing a plurality of the cycle values corresponding to a plurality of the first input data;

an address pointer supplying a writing address and a reading address to the data register file and the wait register file;

a counter decrementing the cycle value set in the wait register file;

a register storing the first input data read from the data register file in synchronization with the operation of the counter;

a detector detecting that the value of the counter becomes zero; and a multiplexer selecting the first input data stored in the register instead of the second input data for use in the normal operation when the detector detects that the value of the counter becomes zero, and supplying the selected one to the target verification block.

5. The semiconductor device having a function verification capability according to claim 1, wherein the internal verification instructions are described in a verification program to verify the operation of the target verification block and executed in synchronization with pipeline operation.

6. The semiconductor device having a function verification capability according to claim 2, wherein the internal verification instructions are described in a verification program to verify the operation of the target verification block and executed in synchronization with a pipeline operation.

7. The semiconductor device having a function verification capability according to claim 3, wherein the register, the counter, the detector, and the multiplexer forming the internal verification block operate in synchronization with a pipeline operation.

8. The semiconductor device having a function verification capability according to claim 4, wherein the data register file, the wait register file, the address pointer, the counter, the register, the detector, and the multiplexer forming the internal verification block operate in synchronization with a pipeline operation.

9. The semiconductor device having a function verification capability according to claim 1 comprises a plurality of the internal verification blocks and the target verification blocks, and each internal verification block corresponds to each target verification block in a one-to-one correspondence between them.

10. The semiconductor device having a function verification capability according to claim 2 comprises a plurality of the internal verification blocks and the target verification blocks, and each internal verification block corresponds to each target verification block in a one-to-one correspondence between them.

11. A semiconductor device having a function verification capability comprising:

an internal verification block receiving and then storing a first input value and a cycle value being a timing to supply the first input value to a target verification block corresponding to the internal verification block, both values being for use in an operation verification according to execution of internal verification instructions during the operation verification, and supplying the first input data to the target verification block instead of a second input data being for use in a normal operation after a time indicated by the cycle time is elapsed after receiving and storing the first input data and the cycle value, wherein, the internal verification block comprises:

a data register file storing a plurality of the continuous first input data;

a wait register file storing a plurality of the cycle values corresponding to a plurality of the first input data;

an address pointer supplying a writing address and a reading address to the data register file and the wait register file;

a counter decrementing the cycle value set in the wait register file;

a register storing the first input data read from the data register file in synchronization with the operation of the counter;

a detector detecting that the value of the counter becomes zero; and a multiplexer selecting the first input data stored in the register instead of the second input data for use in the normal operation when the detector detects that the value of the counter becomes zero, and supplying the selected one to the target verification block.

12. A semiconductor device having a function verification capability according to claim 11, wherein the data register file, the wait register file, the address pointer, the counter, the register, the detector, and the multiplexer forming the internal verification block operate in synchronization with a pipeline operation.

* * * * *